(12) United States Patent
Ma et al.

(10) Patent No.: US 6,547,583 B1
(45) Date of Patent: Apr. 15, 2003

(54) LOCKING DEVICE OF ZERO INSERTION FORCE SOCKET CONNECTOR

(75) Inventors: Hao-Yun Ma, Tu-Chen (TW); Hsiang-Ping Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/041,085

(22) Filed: Dec. 28, 2001

(51) Int. Cl.$^7$ ................................................ H01R 13/62
(52) U.S. Cl. ........................................ 439/342; 439/259
(58) Field of Search ................................. 439/342, 259, 439/260, 261, 262, 263, 264, 265, 266, 451, 370

(56) References Cited

U.S. PATENT DOCUMENTS 6,059,596 A * 5/2000 Pei et al. ................... 439/342

\* cited by examiner

*Primary Examiner*—Renee Luebke
*Assistant Examiner*—Alexander Gilman
(74) *Attorney, Agent, or Firm*—Wei Te Chung

(57) ABSTRACT

A socket connector includes a base housing defining cells receiving and retaining conductive contact elements therein and a cover movably supported on a top face of the base housing. The base housing has a bottom face mounted to a circuit board and the contact elements have tails extending beyond the bottom face and electrically connected to the circuit board. The cover carries an electronic package having depending pin legs and defines passages through which the pin legs extend. The pin legs partially extend into the cells whereby when the cover is moved from an initial, non-engaged position to a final, engaged position, the pin legs are brought into contact with the contact elements to establish an electrical connection therebetween. A cavity is defined in the housing for receiving a tool to drive the movement of the cover with respect to the housing toward to the engaged position. A stuffer locker includes a stuffer body removably fit into the cavity and a stop flange abutting against an edge of the cover to secure the cover at the engaged position. The stuffer body forms raised ribs for interferentially engaging the cavity thereby firmly retaining the stuffer locker in the cavity.

8 Claims, 5 Drawing Sheets

LOCKING DEVICE OF ZERO INSERTION FORCE SOCKET CONNECTOR

BACKGROUND OF THE INVENTION

1. Field of the Invention

The present invention generally relates to a Zero Insertion Force (ZIF) socket connector for mounting an electronic package, such as a central processing unit module, to a circuit board, and more particular to a stuffer locker for the ZIF socket connector.

2. The Related Arts

Zero Insertion Force (ZIF) socket connectors for mounting an electronic package, such as a Central Processing Unit (CPU) module, to a circuit board, such as a main circuit board of a computer, are known in the field of connectors. The ZIF socket connector comprises a stationary portion, often referred to as a base housing, mounted to the main circuit board and a movable portion, often referred to as a cover, slidably supported on the stationary portion. The movable portion carries the CPU module and brings pin legs of the CPU module into engagement with conductive contact elements retained in the stationary portion when it moves. The movement of the movable portion of the ZIF socket connector can be achieved by means of a cam-based mechanism. Examples are U.S. Pat. Nos. 5,489,218 and 5,679,020. What is disadvantageous is that the cam mechanism occupies an additional space, which is against the trend of miniaturization of the computer industry.

U.S. Pat. No. 5,730,615 teaches a ZIF socket connector which omits the cam mechanism. Instead, an additional tool is required to move the movable portion with respect to the stationary portion. This saves the space occupied by the cam mechanism and effectively reduces the footprint of the socket connector on the main circuit board. However, since no cam mechanism is involved in the socket connector of this type, there is generally no way to ensure that the movable portion be maintained at the position where the pin legs of the CPU module engage the contact elements of the stationary portion. An undesired backward movement may be induced on the movable portion due to vibration or other environmental factors. This in turn causes disengagement of the pin legs from the corresponding contact elements.

Thus, a locking device optionally mounted to the ZIF socket connector for ensuring the electrical engagement thereof with the CPU module is desired.

SUMMARY OF THE INVENTION

Accordingly, an object of the present invention is to provide a socket connector comprising a locking device for securing a movable portion at a desired position with respect to a stationary portion whereby engagement between pin legs of an electronic package carried by the movable portion and contact elements retained in the stationary portion can be maintained.

Another object of the present invention is to provide a stuffer locker for securing a movable portion of a socket connector at an engaged position.

To achieve the above objects, in accordance with the present invention, a Zero Insertion Force (ZIF) socket connector comprises a base housing defining cells receiving and retaining conductive contact elements therein and a cover movably supported on a top face of the base housing. The base housing has a bottom face mounted to a circuit board and the contact elements have tails extending beyond the bottom face and electrically connected to the circuit board. The cover carries an electronic package having depending pin legs and defines passages through which the pin legs extend. The pin legs partially extend into the cells whereby when the cover is moved from an initial, non-engaged position to a final, engaged position, the pin legs are brought into contact with the contact elements to establish an electrical connection therebetween. A cavity is defined in the housing for receiving a tool to drive the movement of the cover with respect to the housing toward to the engaged position. A stuffer locker comprises a stuffer body removably fit into the cavity and a stop flange abutting against an edge of the cover to secure the cover at the engaged position. The stuffer body forms raised ribs for interferentially engaging the cavity thereby firmly retaining the stuffer locker in the cavity.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
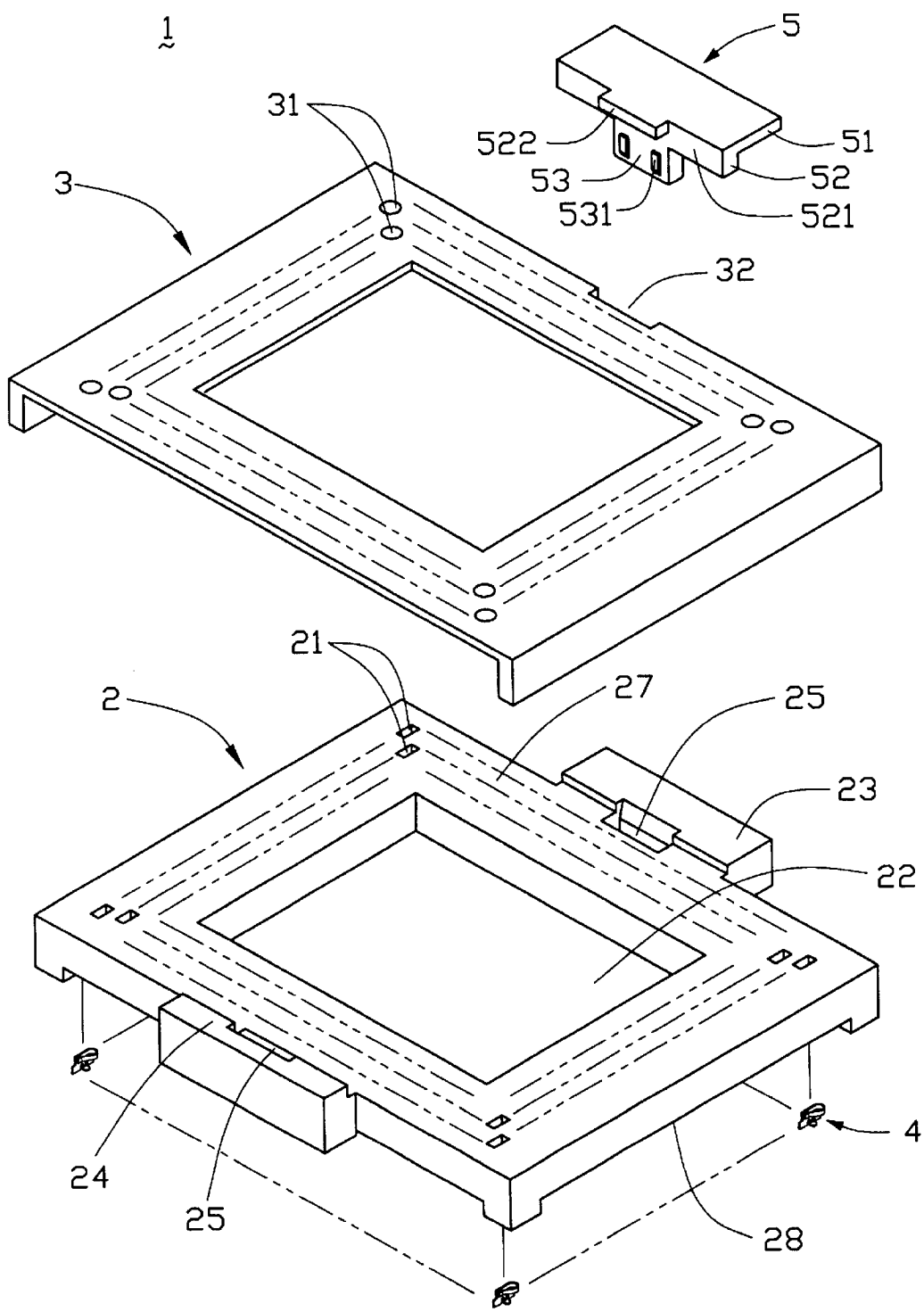
FIG. 1 is an exploded view of a Zero Insertion Force (ZIF) socket connector and a stuffer locker constructed in accordance with the present invention.
Figure 2A:
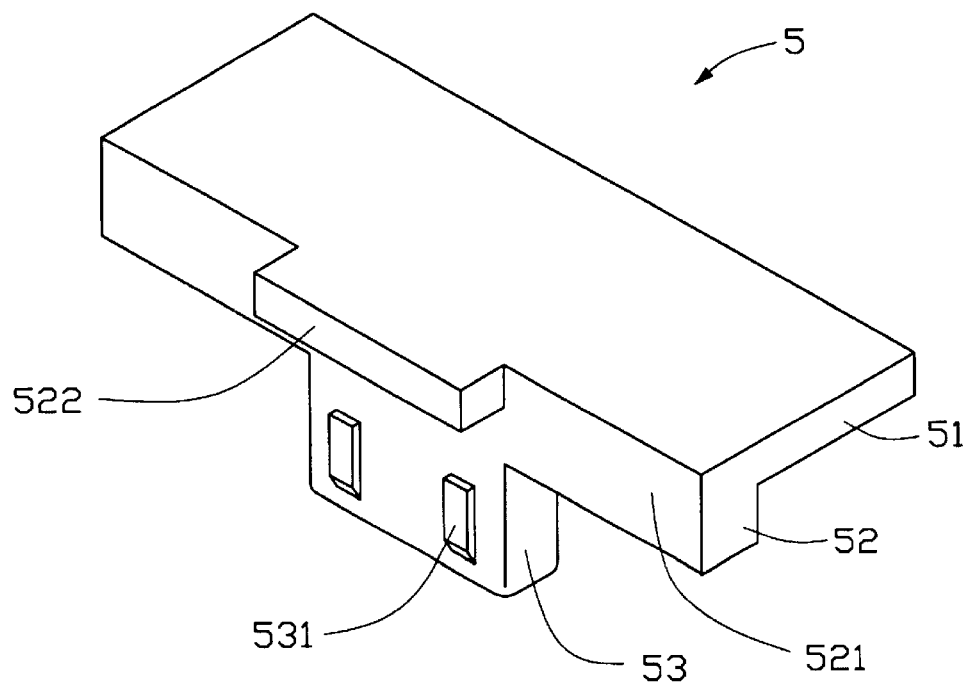
FIG. 2A is a perspective view of the stuffer locker of the present invention.
Figure 2B:
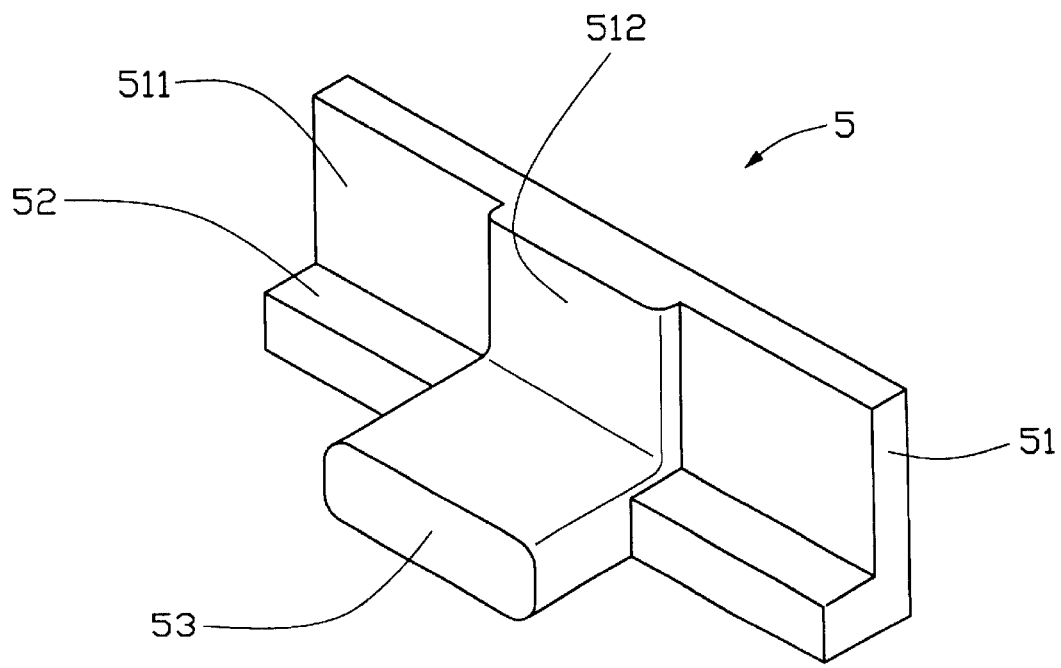
FIG. 2B is another perspective view of the stuffer locker of the present invention.

With reference to the drawings and particularly to FIG. 1, a socket connector, broadly designated with reference numeral 1, comprises a stationary base housing 2 and a movable cover 3 slidably supported on a top face 27 of the base housing 2. The base housing 2 defines a central opening 22 and a number of cells 21 arranged around the central opening 22. Each cell 21 receives and retains a conductive contact element 4 therein 2. The base housing 2 has a bottom face 28 that can be positioned on a circuit board (not shown) and the contact elements 4 have tail portions (not labeled) extending beyond the bottom face 28 for being soldered to or otherwise connected to the circuit board. The cover 3 defines a number of passages 31 respectively corresponding to and in registration with the cells 21 of the base housing 2. The cover 3 can carry an electronic package (not shown), such as a Central Processing Unit (CPU) module, thereon with depending pin legs of the CPU module extending through the passages 31 and partially into the cells 21. When the cover 3 is moved with respect to the base housing 2 from a non-engaged position to an engaged position, the pin legs of the CPU module are brought into engagement with the contact elements 4 thereby forming electrical connection therebetween.

Figure 3:
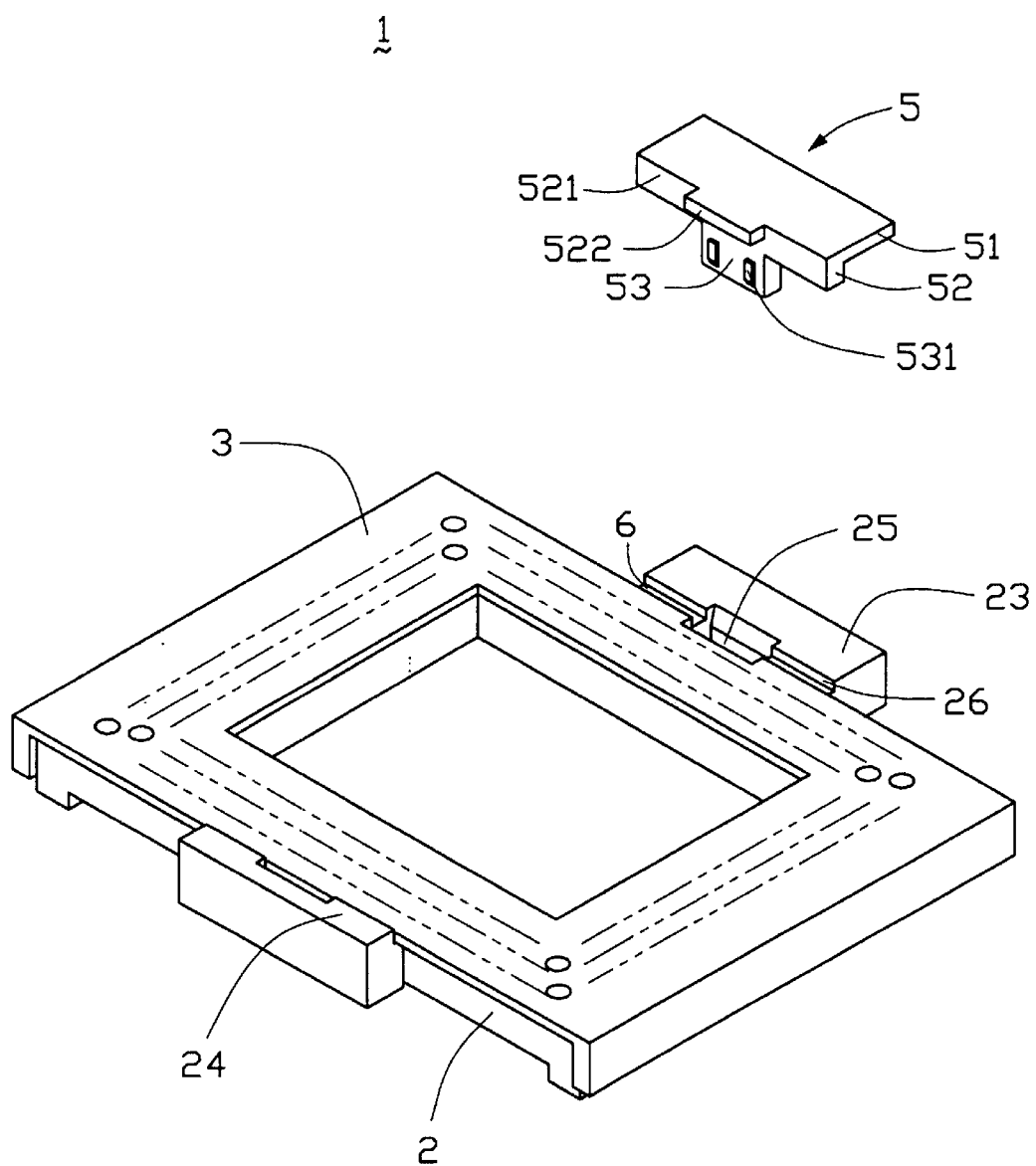
FIG. 3 is an assembled view of the ZIF socket connector before the stuffer locker is mounted to the socket connector.
Figure 4:
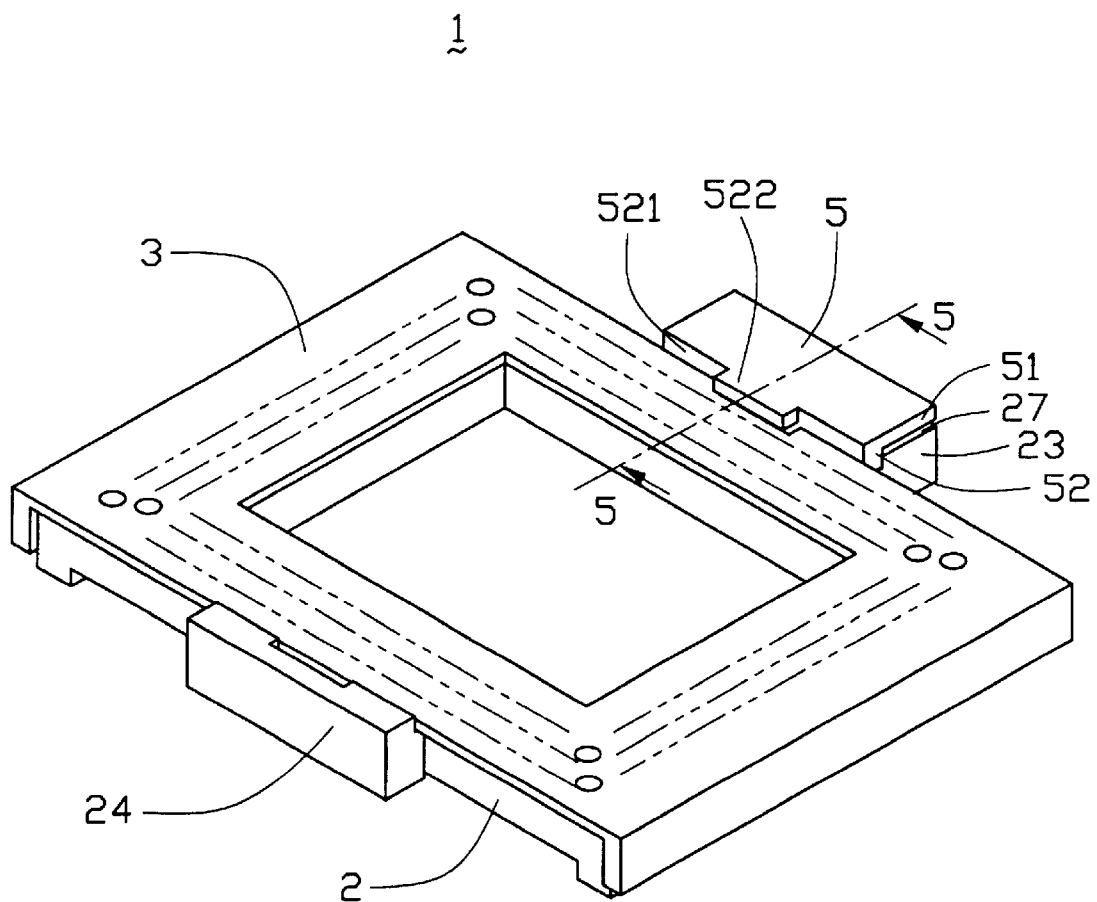
FIG. 4 is similar to FIG. 3 but showing the stuffer locker mounted to the socket connector.
Figure 5:
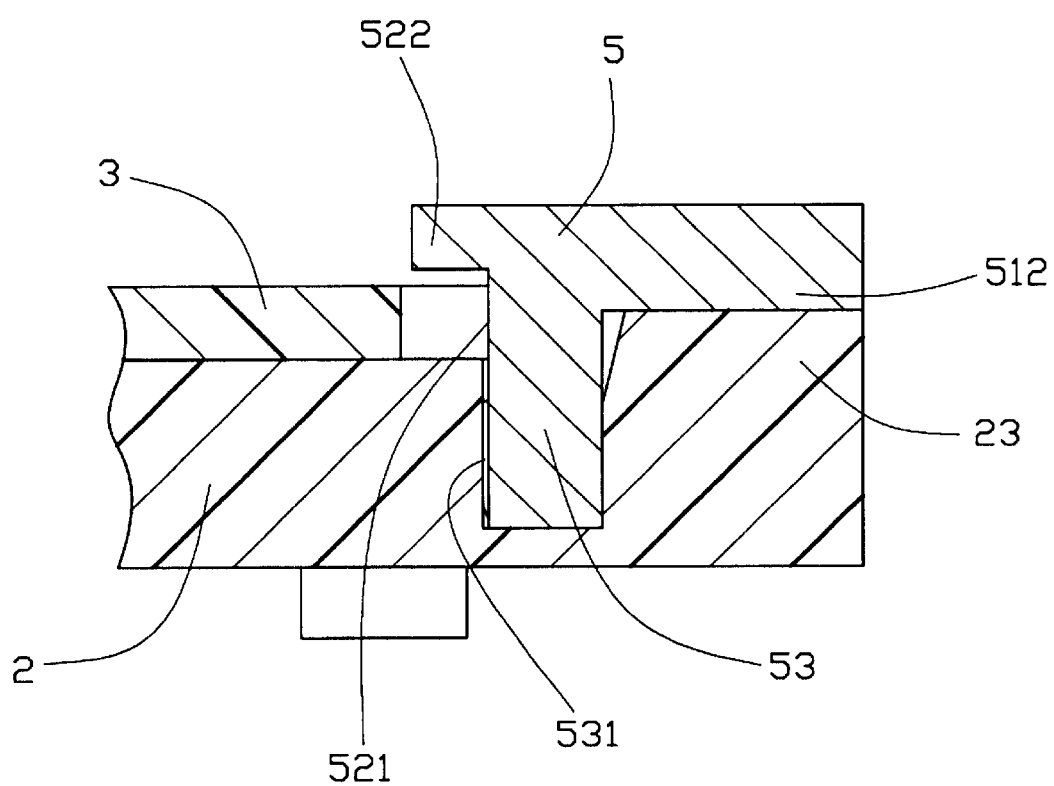
FIG. 5 is a cross-sectional view taken along line V—V of FIG. 4.

The base housing 2 forms first and second projecting blocks 23, 24 respectively on opposite side edges thereof. Each block 23, 24 defines a cavity 25 for receiving an end of a tool (not shown), such as a screwdriver, to drive the movement of the cover 3 with respect to the housing 2 between the non-engaged position and the engaged position. If desired, at least one recess 32 is defined in the cover 3 corresponding to the cavity 25. Each block 23, 24 has a cover-facing surface 26 that defines the non-engaged position and the engaged position of the cover 3 and limits the movement of cover 3. A space 6 is formed between the first (or second) block 23 (24) and a corresponding edge (not labeled) of the cover 3 when the cover 3 is at the engaged position (non-engaged position), as shown in FIG. 3.

Also referring to FIGS. 2A, 2B, and 3–5, a stuffer locker 5 comprises a stuffer body 53 sized to vertically fit into the cavity 25 and a stop flange 52 horizontally extending from opposite sides of the stuffer body 53. The stop flange 52 has a thickness substantially corresponding to or smaller than the space 6 so as to be received in the space 6 between the cover-facing surface 26 of the first or second block 23, 24 and the corresponding edge of the cover 3 with a surface 521 of the stop flange 52 abutting against the edge of the cover 3 thereby securing the cover 3 at the engaged position or the non-engaged position. Preferably, the cover 3 is secured at the engaged position between the second block 24 and the stuffer locker 5. Raised ribs 531 are formed on a surface of the stuffer body 53 for forming interferential engagement between the stuffer body 53 and the cavity 25 thereby securely attaching the stuffer locker 5 to the socket connector 1.

The stop flange 52 has a horizontally extending plate 51 positioned on a top face (not labeled) of the block 23, 24. Preferably, a projection 512 is formed on an underside 511 of the plate 51 whereby gaps 27 are formed between the underside 511 of the plate 51 and the top face of the block 23 on opposite side of the projection 512 for receiving a tool for forcing the stuffer locker 5 out of the cavity 25 of the socket connector 1.

A lug 522 extends from the surface 521 of the stop flange 52 toward the cover 3. The lug 522 is sized to abut against the electronic package for securing the electronic package and the cover at the engaged position. The lug 522 may be sized to partially fit into the recess 32 of the cover 3 for more securely fixing the cover 3 at the engaged position.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A socket connector adapted to mount an electronic package having depending pin legs to a circuit board, the socket connector comprising:

a base housing having a bottom face adapted to face the circuit board and a top face in which cells are defined, the base housing further defining a cavity in a top face thereof;

conductive contact elements received and retained in the cells, each contact element extending beyond the bottom face of the housing for electrically connecting to the circuit board;

a cover supported on the top face of the base housing and movable between first and second positions with respect to the base housing, the cover defining passages corresponding to and in registration with the cells, the cover being adapted to carry the electronic package with the pin legs extending through the passages and partially into the cells whereby when the cover is moved from the first position to the second position, the pin legs are brought into engagement with the contact elements; and a removable stuffer locker comprising a stuffer body fit into the cavity of the base and a stop flange having a surface abutting against a first side edge of the cover to secure the cover at the second position.

2. The socket connector as claimed in claim 1, wherein the base housing forms a first block on a first side thereof, the first block having a surface facing and spaced from the first side edge of the cover a channel when the cover is at the second position, the cavity being defined in the first block such that the stop flange is received in the channel when the stuffer body is fit in the cavity.

3. The socket connector as claimed in claim 2, wherein the stuffer locker comprises a plate extending from the stop flange for resting on a top face of the first block, and wherein the plate has an underside on which a projection is formed for abutting the top face of the first block and a gap is formed between the underside of the plate and the top face of the first block, the gap being adapted to receive a tool for removing the stuffer locker out of the cavity.

4. The socket connector as claimed in claim 1, wherein raised ribs are formed on the stuffer body for interferential engagement with the cavity.

5. The socket connector as claimed in claim 1, wherein a lug extends from the surface of the stop flange, adapted to engage the electronic package for securing the electronic package at the second position.

6. The socket connector as claimed in claim 5, wherein the cover defines a recess corresponding to the lug and wherein the lug is sized to be at least partially received in the recess for more securely fixing the cover at the second position.

7. The socket connector assembly as claimed in claim 2, wherein the base housing forms a second block on an opposite second side thereof, the cover being secured at the second position between the second block and the stop flange of the stuffer locker.

8. The socket connector as claimed in claim 1, wherein the base housing forms a block on one side thereof opposite to the cavity, the cover being secured at a second position between the block and the stuffer locker.

* * * * *